(12) United States Patent
Nakamura et al.

(10) Patent No.: US 8,686,397 B2
(45) Date of Patent: Apr. 1, 2014

(54) LOW DROOP LIGHT EMITTING DIODE STRUCTURE ON GALLIUM NITRIDE SEMIPOLAR SUBSTRATES

(75) Inventors: Shuji Nakamura, Santa Barbara, CA (US); Steven P. DenBaars, Goleta, CA (US); Shinichi Tanaka, Santa Barbara, CA (US); Daniel F. Feezell, Santa Barbara, CA (US); Yuji Zhao, Goleta, CA (US); Chih-Chien Pan, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/493,430

(22) Filed: Jun. 11, 2012

(65) Prior Publication Data

US 2012/0313076 A1    Dec. 13, 2012

Related U.S. Application Data

(60) Provisional application No. 61/495,829, filed on Jun. 10, 2011.

(51) Int. Cl.
*H01L 29/06*        (2006.01)
(52) U.S. Cl.
USPC  257/13; 257/15; 257/E33.008; 257/E33.025; 438/47
(58) Field of Classification Search
USPC .......... 257/13, 15, E33.008, E33.025; 438/47
See application file for complete search history.

(56) References Cited

U.S. PATENT DOCUMENTS

| | | | |
|---|---|---|---|
| 7,846,757 B2 | 12/2010 | Farrell, Jr. et al. | |
| 2002/0195606 A1 | 12/2002 | Edmond et al. | |
| 2003/0005880 A1* | 1/2003 | Razeghi | 117/86 |
| 2006/0049415 A1 | 3/2006 | Liao et al. | |
| 2006/0169990 A1 | 8/2006 | Taki et al. | |
| 2007/0093073 A1 | 4/2007 | Farrell et al. | |
| 2007/0096077 A1 | 5/2007 | Sanga et al. | |
| 2007/0110112 A1 | 5/2007 | Sugiura | |
| 2008/0164489 A1 | 7/2008 | Schmidt et al. | |
| 2008/0191223 A1* | 8/2008 | Nakamura et al. | 257/95 |
| 2008/0296626 A1 | 12/2008 | Haskell et al. | |
| 2009/0039367 A1 | 2/2009 | Iso et al. | |
| 2009/0072262 A1 | 3/2009 | Iza et al. | |
| 2009/0212277 A1 | 8/2009 | Akita et al. | |
| 2009/0212278 A1 | 8/2009 | Jorgenson et al. | |
| 2010/0075175 A1* | 3/2010 | Poblenz et al. | 428/697 |
| 2010/0189981 A1 | 7/2010 | Poblenz et al. | |

(Continued)

OTHER PUBLICATIONS

Akazawa et al., "Small valence-band offset of $In_{0.17}Al_{0.83}N/GaN$ heterostructure grown by metal-organic vapor phase epitaxy", Applied Physics Letters 96, 132104 (2010), pp. 132104-1 to 132104-3.

(Continued)

*Primary Examiner* — Tu-Tu Ho
(74) *Attorney, Agent, or Firm* — Gates & Cooper LLP

(57) ABSTRACT

A light emitting diode structure of (Al,Ga,In)N thin films grown on a gallium nitride (GaN) semipolar substrate by metal organic chemical vapor deposition (MOCVD) that exhibits reduced droop. The device structure includes a quantum well (QW) active region of two or more periods, n-type superlattice layers (n-SLs) located below the QW active region, and p-type superlattice layers (p-SLs) above the QW active region. The present invention also encompasses a method of fabricating such a device.

26 Claims, 12 Drawing Sheets

(56) References Cited

U.S. PATENT DOCUMENTS

| | | | |
|---|---|---|---|
| 2010/0190284 | A1 | 7/2010 | Enya et al. |
| 2010/0213439 | A1 | 8/2010 | Ueno et al. |
| 2010/0309943 | A1 | 12/2010 | Chakraborty et al. |
| 2010/0322276 | A1 | 12/2010 | Yoshizumi et al. |
| 2011/0062449 | A1 | 3/2011 | Farrell, Jr. et al. |
| 2011/0064103 | A1 | 3/2011 | Ohta et al. |
| 2011/0073888 | A1 | 3/2011 | Ueno et al. |
| 2012/0037881 | A1* | 2/2012 | Kim et al. .................. 257/13 |

OTHER PUBLICATIONS

Beattie et al., "Auger effect in semiconductors". Proceedings of the Royal Society of London, vol. 249, (1959), pp. 16-29.
Butte et al., "Current status of AlInN layers lattice-matched to GaN for photonics and electronics", Journal of Physics D: Applied Physics 40 (2007), pp. 6328-6344.
Chen et al., "Improved performance of InAlN-based Schottky solar-blind photodiodes", Applied Physics Letters 94, 213504 (2009), pp. 213504-1 to 213504-3.
Cheng et al., "Characterization of Mg-doped AlInN grown by metalorganic vapor phase epitaxy", Physica Status Solidi (C) 5, No. 6 (2008), pp. 1685-1687.
Choi et al., "Improvement of peak quantum efficiency and efficiency droop in III-nitride visible light-emitting diodes with an InAlN electron blocking layer", Applied Physics Letters 96, 221105 (2010), pp. 221105-1 to 221105-3.
Efremov et al., "Effect of the Joule Heating on the Quantum Efficiency and Choice of Thermal Conditions for High-Power Blue InGaN/GaN LEDs". Semiconductors, vol. 40, No. 5, (2006, pp. 605-610.
Hader et al., "On the importance of radiative and Auger losses in GaN-based quantum wells". Applied Physics Letters, vol. 92, (2008), p. 261103.
Matthews et al., "Defects in Epitaxial Multilayers". Journal of Crystal Growth, vol. 32, (1976), pp. 265-273.
Monemar et al., "Defect related issued in the "current roll-off" in InGaN based light emitting diodes". Applied Physics Letters, vol. 91, (2007), p. 181103.
Nakamura et al., " High-Brightness InGaN Blue, Green and Yellow Light-Emitting Diodes with Quantum Well Structures", Japanese Journal of Applied Physics, vol. 34 (1995), pp. L797-L799.
Pan et al., "Vertical Stand Transparent Light-Emitting Diode Architecture for High-Efficiency and High-Power Light-Emitting Diodes". Japanese Journal of Applied Physics, vol. 49, (2010), p. 080210.
Piprek, Joachim, "Efficiency droop in nitride-based light-emitting diodes", Physica Status Solidi A, vol. 207, No. 10 (2010), pp. 2217-2225.
Rozhansky et al., "Analysis of the Causes of the Decrease in the Electroluminescence Efficiency of AlGaInN Light-Emitting-Diode Heterostructures at High Pumping Density". Semiconductors, vol. 40, No. 7, (2006), pp. 861-867.
Kim, "Origin of efficiency droop in GaN-based light-emitting diodes". Applied Physics Letters, vol. 91, (2007), p. 183507.
Schubert et al., "Effect of dislocation density on efficiency droop in GaInN/GaN light-emitting diodes". Applied Physics Letters, vol. 91, (2007), p. 231114.
Shen et al., "Auger recombination in InGaN measured by photoluminescence". Applied Physics letters, vol. 91, (2007), p. 141101.
Xie et al., "On the efficiency droop in InGaN multiple quantum well blue light emitting diodes and its reduction with p-doped quantum well barriers". Applied Physics Letters, vol. 93, (2008), p. 121107.
Zhao et al., "High-Power Blue-Violet Semipolar (2021) InGaN/GaN Light-Emitting Diodes with Low Efficiency Droop at 200 A/cm2". Applied Physics Express, vol. 4, (2011), p. 082104.
PCT International Search Report dated Aug. 18, 2012 for PCT Application No. PCT/US12/41876 filed Jun. 11, 2012.
Nakamura et al., "Hight Brightness InGaN Blue, Green and Yellow Light-Emitting Diodes with Quantum Well Structures". Japanese Journal of Applied Physics 34 (1995), pp. L797-L799.
PCT International Search Report dated Sep. 17, 2012 for application No. PCT/US12/41872.

\* cited by examiner though it exhibits reduced droop. The
LOW DROOP LIGHT EMITTING DIODE STRUCTURE ON GALLIUM NITRIDE SEMIPOLAR SUBSTRATES

CROSS REFERENCE TO RELATED APPLICATION

This application claims the benefit under 35 U.S.C. Section 119(e) of co-pending and commonly-assigned U.S. Provisional Patent Application Ser. No. 61/495,829, filed on Jun. 10, 2011, by Shuji Nakamura, Steven P. DenBaars, Shinichi Tanaka, Daniel Feezell, Yuji Zhao, and Chih-Chien Pan, entitled "LOW DROOP LIGHT EMITTING DIODE STRUCTURE ON GALLIUM NITRIDE SEMIPOLAR {20-2-1} SUBSTRATES," which application is incorporated by reference herein.

This application is related to co-pending and commonly-assigned U.S. Utility patent application Ser. No. 13/493,483, filed on same date herewith, by Shuji Nakamura, Steven P. DenBaars, Daniel F. Feezell, Chih-Chien Pan, Yuji Zhao and Shinichi Tanaka, and entitled "HIGH EMISSION POWER AND LOW EFFICIENCY DROOP SEMIPOLAR BLUE LIGHT EMITTING DIODES," which application claims the benefit under 35 U.S.C. Section 119(e) of U.S. Provisional Patent Application Ser. No. 61/495,840, filed on Jun. 10, 2011, by Shuji Nakamura, Steven P. DenBaars, Daniel F. Feezell, Chih-Chien Pan, Yuji Zhao and Shinichi Tanaka, and entitled "HIGH EMISSION POWER AND LOW EFFICIENCY DROOP SEMIPOLAR {20-2-1} BLUE LIGHT EMITTING DIODES,"; and U.S. Utility application Ser. No. 13/284,449 filed on Oct. 28, 2011, by Matthew T. Hardy, Steven P. DenBaars, James S. Speck, and Shuji Nakamura, entitled "STRAIN COMPENSATED SHORT-PERIOD SUPERLATTICES ON SEMIPOLAR GAN FOR DEFECT REDUCTION AND STRESS ENGINEERING," which application claims the benefit under 35 U.S.C. Section 119(e) of co-pending and commonly-assigned U.S. Provisional Application Ser. No. 61/408,280 filed on Oct. 29, 2010, by Matthew T. Hardy, Steven P. DenBaars, James S. Speck, and Shuji Nakamura, entitled "STRAIN COMPENSATED SHORT-PERIOD SUPERLATTICES ON SEMIPOLAR GAN FOR DEFECT REDUCTION AND STRESS ENGINEERING,";

U.S. Utility patent application Ser. No. 12/908,793, entitled "LIGHT EMITTING DIODE PACKAGING METHOD WITH HIGH LIGHT EXTRACTION AND HEAT DISSIPATION USING A TRANSPARENT VERTICAL STAND STRUCTURE," filed on Oct. 20, 2010, by Chih Chien Pan, Jun Seok Ha, Steven P. DenBaars, Shuji Nakamura, and Junichi Sonoda, which application claims the benefit under 35 U.S.C. Section 119(e) of U.S. Provisional Patent Application Ser. No. 61/258,056, entitled "LED PACKAGING METHOD WITH HIGH LIGHT EXTRACTION AND HEAT DISSIPATION USING A TRANSPARENT VERTICAL STAND STRUCTURE," filed on Nov. 4, 2009, by Chih Chien Pan, Jun Seok Ha, Steven P. DenBaars, Shuji Nakamura, and Junichi Sonoda;

all of which applications are incorporated by reference herein.

BACKGROUND OF THE INVENTION

1. Field of the Invention

The invention is related generally to the field of electronic and optoelectronic devices, and more particularly, to a low droop light emitting diode (LED) structure on gallium nitride (GaN) semipolar (e.g., {20-1-1}) substrates.

2. Description of the Related Art (Note: This application references a number of different publications as indicated throughout the specification by one or more reference numbers within brackets, e.g., [X]. A list of these different publications ordered according to these reference numbers can be found below in the section entitled "References." Each of these publications is incorporated by reference herein.)

At present, LEDs are utilized in high-brightness and high-power applications, such as illumination and automotive lighting, due to recent improvements in the external quantum efficiency (EQE). For commercialization of general lighting, LEDs must still overcome a major roadblock, known as "efficiency droop".

Efficiency droop refers to the decay of the EQE at high driving current. As a result of droop, either more LED chips, or larger-area LED chips, are needed for high power devices, which results in increased wafer area and leads to higher costs.

For example, car lamp assembly and illumination manufacturers cannot completely shift to using LED devices because of their high cost. If the droop problem is resolved, these manufacturers can shift to LED devices completely, and the LED market will spread greatly.

The present invention comprises a low-droop LED structure on a GaN semipolar {20-2-1} substrate that exhibits a low Droop ratio and thus will help expedite wide spread adoption of LED lighting.

The state of the art prior to this invention includes (Al,Ga,In)N optical devices grown on polar {0001}, nonpolar {11-20} and {10-10}, and semipolar {10-1-1}, {11-22} and {20-21} GaN crystal planes. The Droop ratio of prior art devices grown on these planes is about 20% (at an emission wavelength of 430 nanometers (nm) and a drive current density of 35 Amps per centimeter square ($A/cm^2$)), as shown in FIG. 1.

FIG. 1 is a graph of EQE (percent, %) and Light Output Power (LOP) in milliwatts (mW) vs. Current Density ($A/cm^2$), for a prior art LED on a {20-2-1} GaN semipolar substrate. FIG. 1 shows the results for EQE for Direct Current (DC) operation (EQE (%)_DC), EQE for pulsed operation (EQE (%)_Pulse), Light Output Power for DC operation (LOP (mW)_DC), and LOP for pulsed operation (LOP (mW)_ Pulse).

Thus, there is a need in the art for improved methods for reducing droop in LEDs. The present invention satisfies this need. Specifically, the present invention describes a low droop LED structure on a GaN semipolar {20-1-1} substrate.

SUMMARY OF THE INVENTION

To overcome the limitations in the prior art described above, and to overcome other limitations that will become apparent upon reading and understanding the present specification, the present invention discloses a light emitting diode structure of (Al,Ga,In)N thin films grown on a GaN semipolar (e.g., {20-2-1}) substrate by metal organic chemical vapor deposition (MOCVD) that exhibits reduced droop. The device structure includes a quantum well (QW) active region of two or more periods, an n-type superlattice (n-SL) or n-SL layers located below the QW active region, and p-type superlattice (p-SL) or p-SL layers above the QW active region. The present invention also encompasses a method of fabricating such a device.

For example, the present invention discloses an opto-electronic device structure, comprising at least a III-nitride light-emitting device structure grown on or above a semipolar Group-III nitride substrate, wherein the light-emitting device structure includes an n-type III-nitride SL, and the light-emitting device structure has an External Quantum Efficiency (EQE) droop of 15% percent or less at a current density of at least 35 Amps per centimeter square (A/cm$^2$).

The light-emitting device can have a light output power that is at least 50 milliwatts and the droop can be less than 1% at the current density of at least 35 A/cm$^2$ and less than 10% at the current density of at least 100 A/cm$^2$.

The light-emitting device structure can have a peak emission at a blue emission wavelength. The active region can emit light having a peak wavelength corresponding to light having a green wavelength or longer.

The semipolar Group-III nitride substrate can be a semi-polar (e.g., 20-2-1) Gallium Nitride (GaN) substrate.

The n-SL can comprise one or more indium (In) containing layers and gallium (Ga) containing layers. The n-SL can comprise layers having different III-nitride composition and each of the layers can be doped with Silicon. The n-SL can comprise alternating InGaN and GaN layers on or above an n-type GaN layer on a semi-polar plane of the substrate.

The n-SL can be located below an active region of the light-emitting device, wherein the active region includes two or more quantum wells (QW).

The active region can comprise one or more indium containing III-nitride quantum wells (QWs) with III-nitride barriers, the quantum wells having a QW number, a QW composition, and a QW thickness, the barriers having a barrier composition, barrier thickness, and barrier doping, the n-SL comprising a number of periods, an SL doping, an SL composition, and layers each having a layer thickness. The QW number, the QW composition, the QW thickness, the barrier composition, the barrier thickness, the barrier doping, the number of periods, the SL doping, the SL composition, and the layer thickness can be such that the LED has a peak emission at a blue emission wavelength or longer, and the droop is 15% or less when the device is driven at a current density of at least 35 Amps per centimeter square (A/cm$^2$).

The device structure can further comprise a first III-nitride layer or buffer layer on or above the GaN substrate, and the n-SL on or above the first layer or buffer layer. The n-SL can comprise alternating first and second III-nitride layers having different III-nitride composition, wherein the first and second III-nitride layers can comprise strain compensated layers that are lattice matched to the first layer or buffer layer, the first and second III-nitride layers can have a thickness that is below their critical thickness for relaxation, and a number of periods of the n-SL can be such that the active region is separated from the first layer or buffer layer by at least 500 nanometers. The active region can comprise at least three InGaN quantum wells with GaN barriers, wherein the InGaN quantum wells have a thickness of at least 3 nanometers.

The device can further comprise a p-type III-nitride SL on or above the active region. The p-type SL on or above the active region can comprise alternating AlGaN and GaN layers.

The substrate can be a semi-polar GaN substrate having a roughened backside wherein the roughened backside extracts light from the light emitting device. The device can further comprise a p-type GaN layer on or above the p-SL; a p-type transparent conductive layer on or above the p-type GaN layer; a p-type pad on or above the p-type transparent conductive layer; an n-type contact to the n-type GaN layer; a Zinc Oxide (ZnO) submount attached to the roughened backside of the semipolar GaN substrate; a header attached to an end of the ZnO submount; and an encapsulant encapsulating the LED. An active area of the LED device structure can be 0.1 mm$^2$ or less.

The present invention further discloses a method of fabricating a light emitting device. The method can comprise growing the n-SL III-nitride layers with $Si_2H_6$ flow, wherein each of the III-nitride layers is doped with Silicon.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes a LED structure comprising GaN thin films grown by MOCVD on GaN semipolar (e.g., {20-2-1}) substrates, for achieving low efficiency droop. The present invention provides a pathway to nitride-based devices free from the droop effect. The structure incorporates an n-SL located below the QWs, a QW active region of two or more periods, and more preferably, at least three periods, and a p-SL above the QWs. This structure shows reduced droop when incorporated into (Al,In,Ga)N devices grown on GaN semipolar (e.g., {20-2-1}) substrates.

On nonpolar and semipolar planes, unbalanced in-plane biaxial strain causes the curvature of the highest valance band to increase. As a result, the symmetry between the valence band and conduction band curvatures is increased. For wide band gap materials, symmetric conduction and valence bands may suppress Auger recombination, which is widely accepted as the mechanism responsible for efficiency droop. Therefore, LEDs grown on nonpolar or semipolar orientations of GaN may show reduced efficiency droop in general. In this invention, the preferred embodiment utilizes the semipolar (20-2-1) plane.

Light-emitting devices grown on semipolar (20-2-1) have shown reduced blue shift and lower Full Width at Half Maximum (FWHM) compared to c-plane light-emitting devices. This difference is particularly strong for high indium compositions (i.e., long wavelength emitters). This observation implies that quantum wells grown on semipolar (20-2-1) may have superior alloy uniformity to those grown on c-plane. Recently, alloy scattering has been implicated as one source of Auger recombination in InGaN/GaN LEDs. With superior alloy uniformity, alloy scattering will be reduced, and therefore LEDs grown on semipolar (20-2-1) should demonstrate reduced efficiency droop in general.

Technical Description

Figure 1:
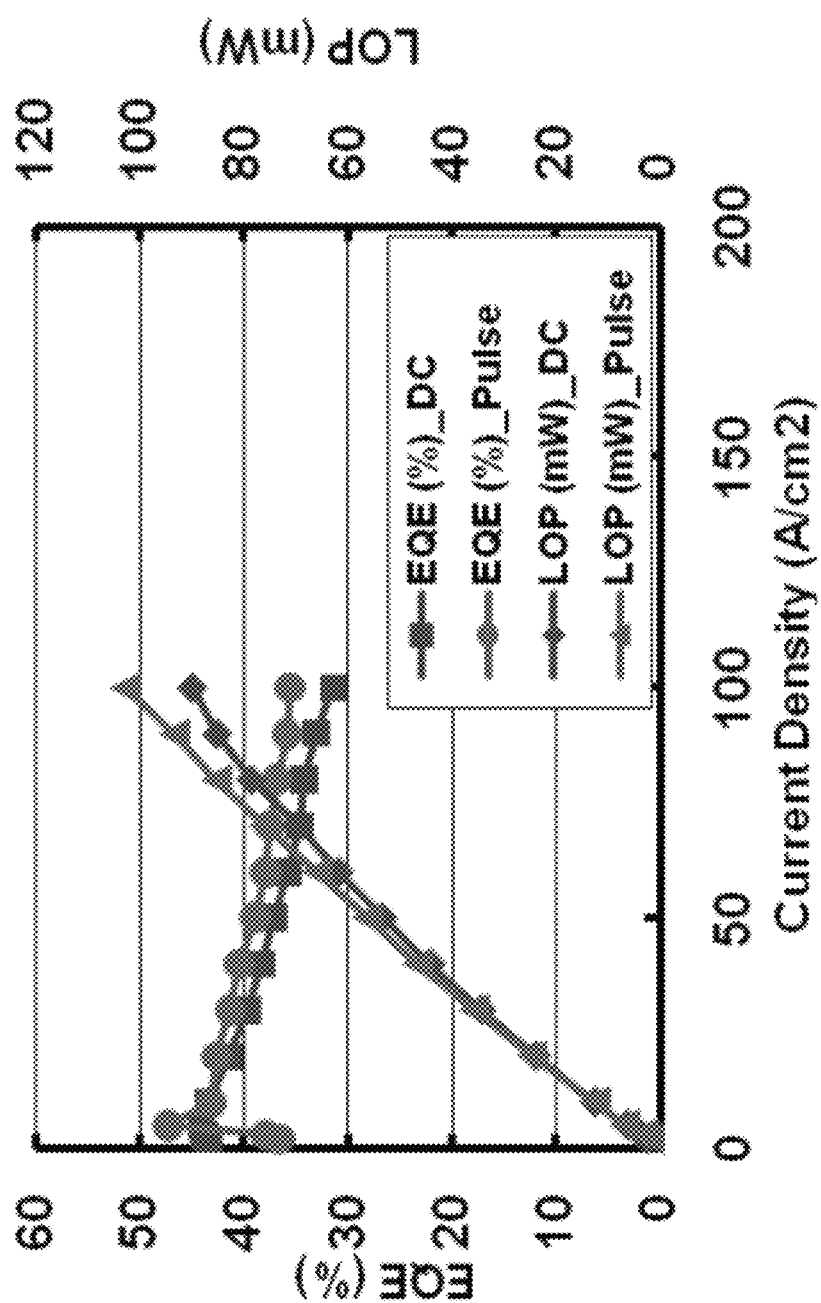
FIG. 1 is a graph of EQE (%) and Light Output Power (LOP) (mW) vs. Current Density (A/cm$^2$) for a prior art LED on a {20-2-1} GaN semipolar substrate.
Figure 2A:
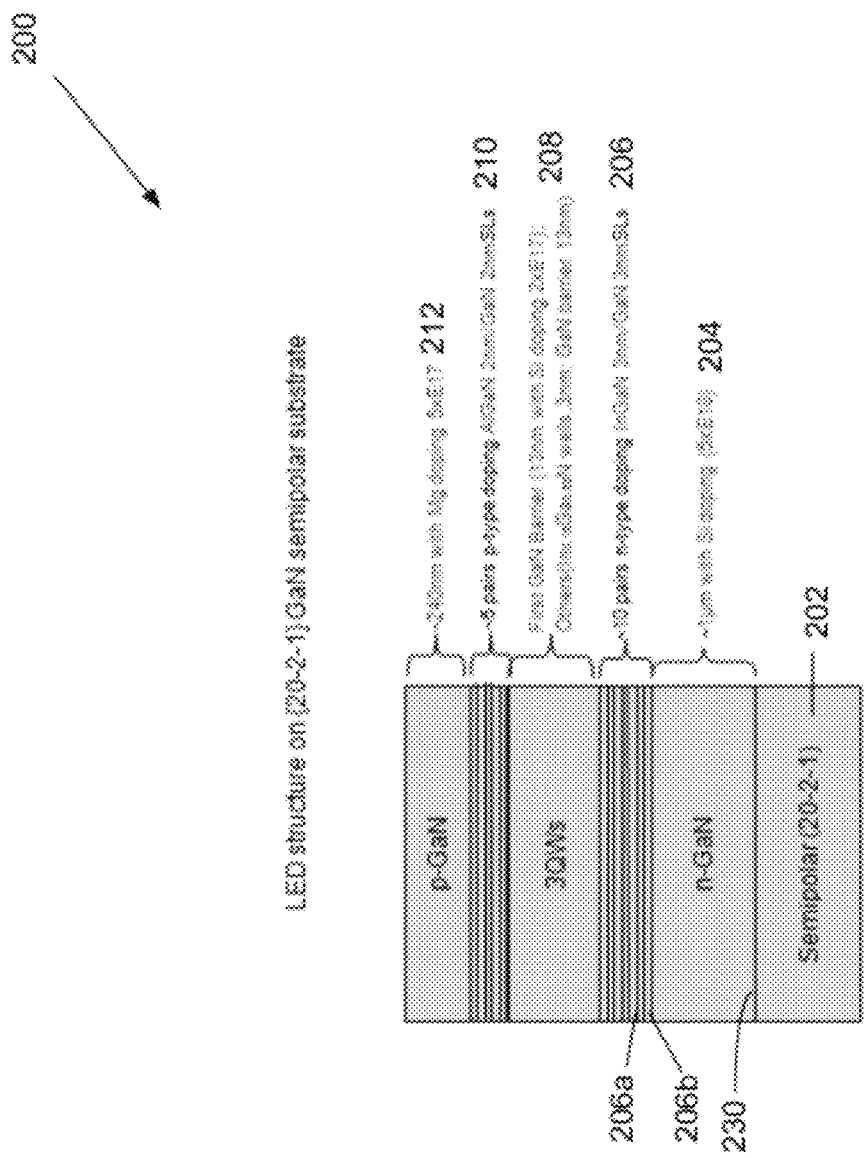
FIG. 2(a) illustrates a cross-sectional schematic of the epi structure of a low droop {20-2-1} LED grown on a semipolar (20-2-1) GaN substrate by Metal Organic Chemical Vapor Deposition (MOCVD), according to one embodiment of the present invention.

FIG. 2(a) illustrates the epi structure 200 of a low droop (20-2-1) LED grown on a GaN semipolar (20-2-1) substrate 202 by MOCVD, according to one embodiment of the present invention. This device structure is comprised of a 1 micrometer (ρm) thick Silicon (Si) doped n-type GaN (n-GaN) layer 204 (Si dopant concentration of $5 \times 10^{18}$ cm$^{-3}$), an n-SL 206 comprised of 10 periods of GaN/InGaN layers (3 nm/3 nm or wherein the GaN layer is 3 nm thick and the InGaN layer is 3 nm thick), and an active layer 208 comprised of a three period multiple QW (MQW) stack with 13 nm thick GaN barriers and 3 nm thick InGaN (e.g., $In_{0.18}Ga_{0.82}N$) quantum wells, wherein the first GaN barrier is doped with Silicon to a concentration of $2 \times 10^{17}$ cm$^3$. This was followed by a p-SL 210 comprised of 5 periods of AlGaN/GaN layers (2 nm/2 nm or wherein the AlGaN layer is 2 nm thick and the GaN layer is 2 nm thick), and a 240 nm thick Mg-doped p-type GaN:Mg (p-GaN) layer 212 (with an Mg dopant concentration of $5 \times 10^{18}$ cm$^3$).

Figure 2B:
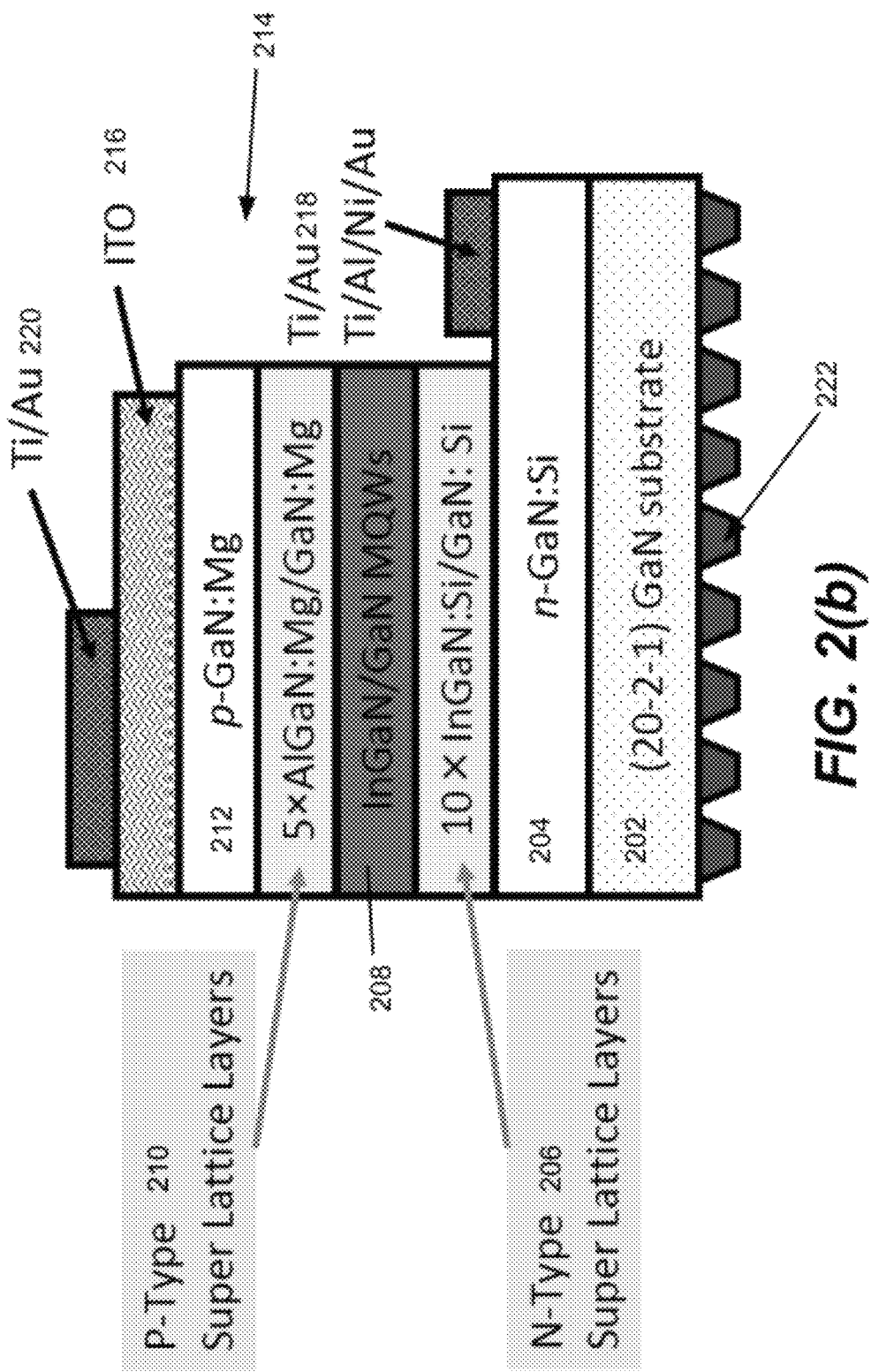
FIG. 2(b) is a cross-sectional schematic of a device structure according to one embodiment of the present invention.

FIG. 2(b) illustrates the device structure 200 processed into a device (e.g., LED), illustrating a mesa 214 and a p-type transparent conductive layer (e.g., indium tin oxide (ITO) transparent p-contact 216) on or above the p-type GaN layer 212. Ti/Al/Au based n-contacts 218 and Ti/Au p-pads 220 are deposited on or above, or make contact to, the n-GaN layer 204 and the ITO transparent p-contact 216, respectively. Surface roughening 222 of the GaN substrate 202 is also shown, wherein the roughened backside 222 has features having a dimension to extract (e.g., scatter, diffract) light emitted by the active region 208 from the LED.

Figure 2C:
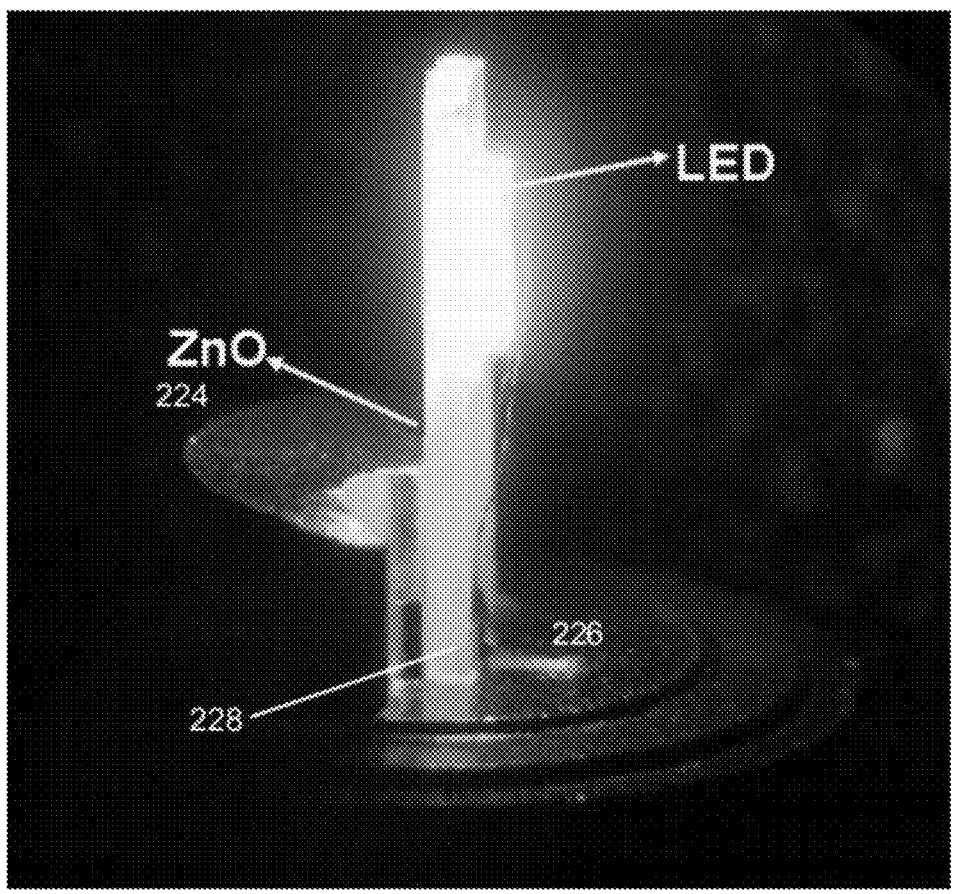
FIG. 2(c) illustrates a Zinc Oxide (ZnO) submount attached to the roughened backside of the semipolar GaN substrate, according to an embodiment of the present invention.

FIG. 2(c) illustrates a Zinc Oxide (ZnO) submount 224 attached to the roughened backside 222 of the semipolar GaN substrate 202 and a header 226 attached to an end 228 226 of the ZnO submount 224. The LED can further comprise an encapsulant encapsulating the LED. An active area of the LED can be 0.1 mm$^2$ or less, for example.

Process Steps

Figure 3:
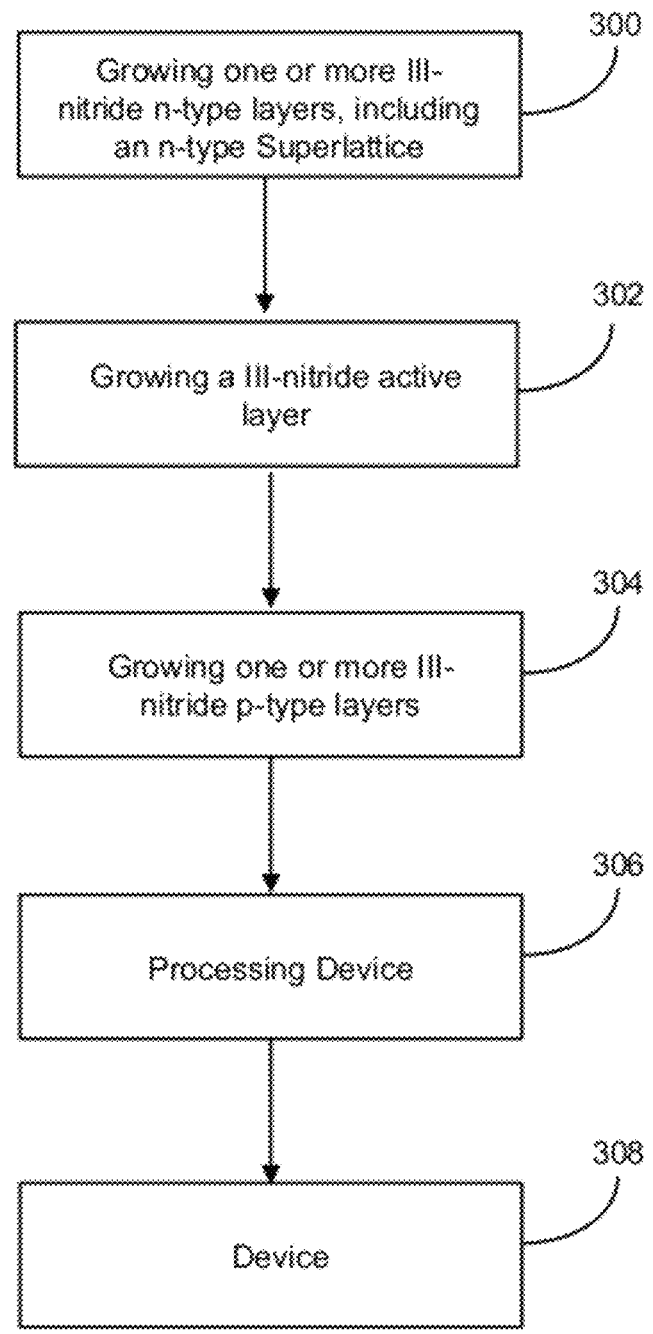
FIG. 3 is a flowchart illustrating a method of fabricating a light emitting device structure, according to an embodiment of the present invention.

FIG. 3 illustrates a method of fabricating or growing a light emitting device or light-emitting device structure. The method can comprise the following steps, referring also to FIG. 2(a) and FIG. 2(b).

Block 300 represents growing one or more first III-nitride layers (e.g., buffer layer) and/or n-type III-nitride layers (e.g., n-type GaN or n-GaN) 204, 206 on or above semipolar Group-III nitride, e.g., on or above a semipolar Group-III nitride (e.g., bulk) substrate 202 or on or above a semi-polar plane 228 of the substrate 202. The semipolar Group-III nitride can be semipolar GaN. The semipolar group-III nitride can be a semipolar (20-2-1) or {20-2-1}GaN substrate 202. The first or buffer layer can comprise one of the n-type layers 204.

The n-type layers can comprise an n-SL 206. The n-SL 206 can be on or above the one or more n-type layers 204, or on or above the first layer or buffer layer.

The n-SL can comprise SL layers 206a, 206b, e.g., one or more indium (In) containing layers and gallium (Ga) containing layers, or alternating first and second III-nitride layers 206a, 206b having different III-nitride composition (e.g., InGaN and GaN layers).

The n-SL 206 can comprise a number of periods (e.g., at least 5, or at least 10), an SL doping, an SL composition, and layers 206a, 206b each having a layer thickness. The first and second III-nitride layers 206a, 206b can comprise strain compensated layers that are lattice matched to the first or buffer layer 204 and can have a thickness that is below their critical thickness for relaxation (e.g., less than 5 nm). The strain compensated layers can be for defect reduction, strain relaxation, and/or stress engineering in the device 200 and/or active region 208. A number of periods of the n-SL 206 can be such that the active region 208 grown in Block 302 is separated from the first layer 204 by at least 500 nanometers.

Further information on strain compensated SL layers can be found in U.S. Utility application Ser. No. 12/284,449 filed on Oct. 28, 2011, by Matthew T. Hardy, Steven P. DenBaars, James S. Speck, and Shuji Nakamura, entitled "STRAIN COMPENSATED SHORT-PERIOD SUPERLATTICES ON SEMIPOLAR GAN FOR DEFECT REDUCTION AND STRESS ENGINEERING," which application is incorporated by reference herein.

Block 302 represents growing an active region or one or more active layer(s) 208 on or above the n-SL (e.g., wherein the n-SL is located below the active layer 208). The active layers 208 can emit light (or electromagnetic radiation) having a peak intensity at a wavelength in a blue or green wavelength range, or longer (e.g., red or yellow light), or a peak intensity at a wavelength of 500 nm or longer. However, the present invention is not limited to devices 200 emitting at particular wavelengths, and the devices 200 can emit at other wavelengths. For example, the present invention is applicable to ultraviolet light emitting devices 200.

The light emitting active layer(s) 208 can include III-nitride or Indium (In) containing III-nitride layers, such as InGaN layers. For example, the Indium containing layers can comprise one or more, two or more, or three or more QWs (having a QW number, a QW composition, and a QW thickness) and QW barriers having a barrier composition, barrier thickness, and barrier doping. For example, the indium containing layers can comprise at least three InGaN QWs with, e.g., GaN barriers. The InGaN QWs can have an Indium composition of at least 7%, at least 10%, at least 18%, or at least 30%, and a thickness or well width of 3 nanometers or more, e.g., 5 nm, at least 5 nm, or at least 9 nm. However, the quantum well thickness can also be less than 3 nm, although it is typically above 2 nm thickness.

Block 304 represents growing one or more III-nitride p-type layers (e.g., a p-SL comprising p-SL layers) on or above the active region. The p-SL can comprise alternating AlGaN and GaN layers, or AlGaN/GaN layers, for example. The p-SL can comprise an AlGaN electron blocking layer.

Layers 204, 206, 208, 210, and 212 can form a p-n junction. Generally, the preferred embodiment of the present invention comprises an LED grown on a GaN semipolar {20-2-1} substrate in which the structure incorporates an n-type SL below the active layer, a MQW active region, and a p-type SL layer above the MQW. The MQW active region should typically comprise two or more QWs, and more preferably, at least three QWs.

The semipolar plane, QW number, the QW composition (e.g., In composition), the QW thickness, the barrier composition, the barrier thickness, the barrier doping, the number of periods of the SL, the SL doping, the SL composition, and the layer thickness can be such that the light emitting device has a peak emission at the desired emission wavelength (e.g., a blue emission wavelength or longer), with the desired droop (e.g., the droop can be 15 percent or less when the device is driven at a current density of at least 35 A/cm$^2$), or wherein alloy scattering is reduced.

The typical growth temperature was ~1185° C. for the n-type GaN layer, with a V/III (the ratio of NH$_3$ mole fraction to trimethyl-gallium mole fraction) ratio of 3000. The active region was grown at a temperature of ~850° C. with a V/III ratio of 12000. All MOCVD growth was performed at atmospheric pressure (AP). However, these conditions are merely provided as an example and other growth conditions are also possible.

Block 306 represents processing the device structure into a device, as illustrated in FIG. 2(b).

The low droop semipolar {20-2-1} LEDs can be further processed as follows (as shown in FIG. 2(b):

1. LEDs with 240×420 μm$^2$ mesa 214 sizes (width by length) can be formed by conventional photolithography, followed by chlorine-based inductively coupled plasma (ICP) etching techniques to form the mesa.

2. An indium tin oxide (ITO) transparent p-contact 216 can be deposited by electron beam deposition.

3. Ti/Al/Au based n-contacts 218 and p-pads 220 can then deposited on the n-GaN layer 204 and the ITO transparent p-contact 216, respectively.

4. The fabricated devices can be packaged on a silver header encapsulated with a silicone dome. The fabricated devices can have a roughened backside and be mounted on a ZnO submount, as shown in FIG. 2(c).

Block 308 represents the end result, a device such as a light-emitting device or device structure grown on or above a semipolar Group-III nitride (e.g., substrate), wherein the light-emitting device structure includes or has an n-SL comprising n-type SL layers. The light-emitting device structure can have an External Quantum Efficiency (EQE) droop of 15% percent or less when the light-emitting device structure is driven at a current density of at least 35 A/cm$^2$. For example, a droop less than 1% at the current density of at least 35 A/cm$^2$ and less than 10% at the current density of at least 100 A/cm$^2$ can be achieved. The light-emitting device can have a light output power that is at least 50 or 100 milliwatts. The droop for the light-emitting device can show improved performance as compared to a light-emitting device grown on polar Group-III nitride.

The present invention further discloses a light-emitting device in which non-isotropic strain is intentionally added to minimize efficiency droop, e.g. wherein the device is a semipolar (e.g., {20-2-1}) or nonpolar nitride-based light emitting diode (LED).

Characterization

All measurements were carried out under pulsed operations at room temperature, and the optical emission power was measured in a calibrated integrating sphere.

The Droop ratio is calculated according to Eq. 1 below (for example, at 35 A/cm$^2$):

$$\text{Droop ratio} = ((\text{MaxEQE} - \text{EQE@35 A/cm}^2)/\text{MaxEQE}) *100(\%), \quad \text{Eq. 1}$$

where Max EQE is the maximum EQE and EQE@35 A/cm$^2$ is the EQE at 35 A/cm$^2$.

Figure 4A:
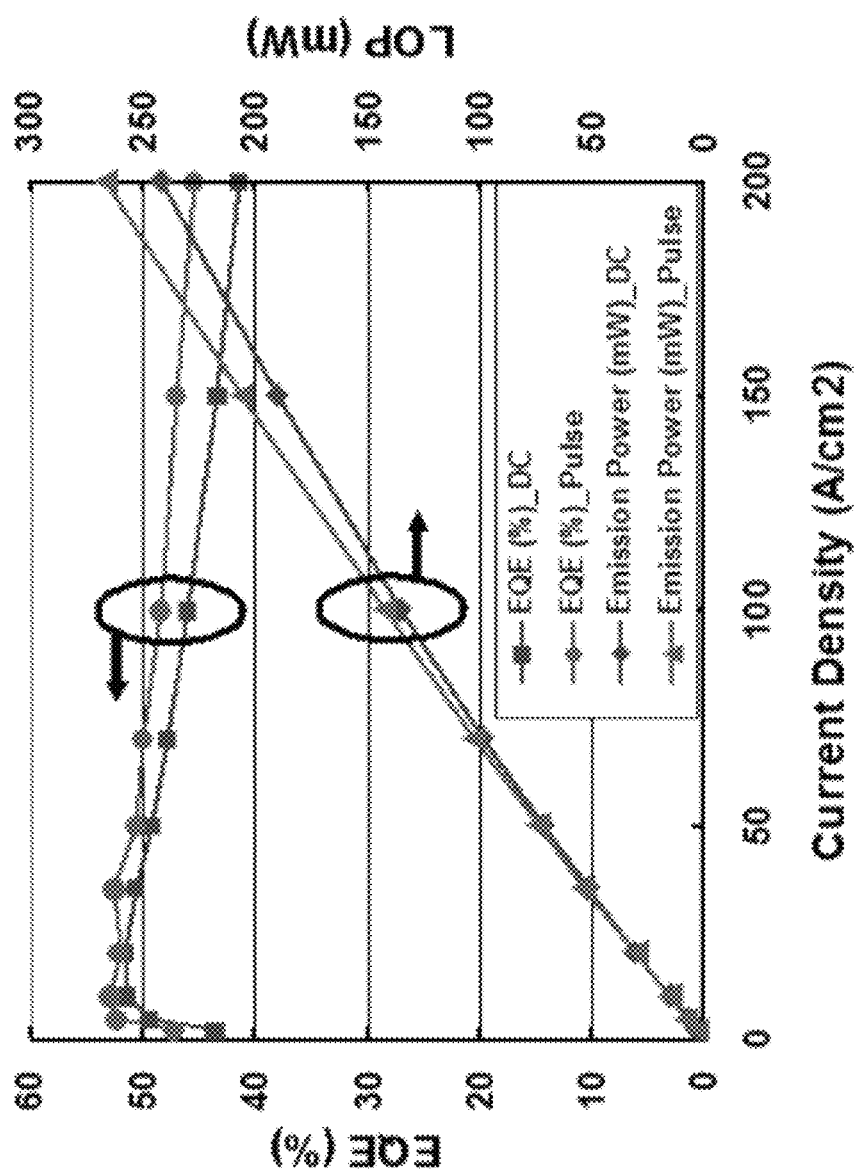
FIG. 4(a) is a graph of EQE (%) and LOP (mW) vs. Current Density (A/cm$^2$) for a device comprising an LED fabricated using a (20-2-1) GaN semipolar substrate using the structure of FIGS. 2(a) and 2(b).

The results from Eq. 1 are shown in FIG. 4(a). FIG. 4(a) is a graph of EQE (%) and LOP (mW) vs. Current Density (A/cm$^2$) for a device comprising an LED fabricated using a GaN semipolar (20-2-1) substrate and having the structure of FIGS. 2(b) and 2(c). FIG. 4(a) shows the results for EQE (%)_DC, EQE (%)_Pulse, LOP (mW)_DC, and LOP (mW)_Pulse.

The Droop ratio in this device is 0.7% (at a current density of 35 A/cm$^2$), 4.25% (at a current density of 50 A/cm$^2$), 8.46% (at a current density of 100 A/cm$^2$), and 14.3% (at a current density of 200 A/cm$^2$).

The Droop performance of this device is superior to that of a c-plane device (grown on sapphire) with a similar epitaxial structure.

Figure 4B:
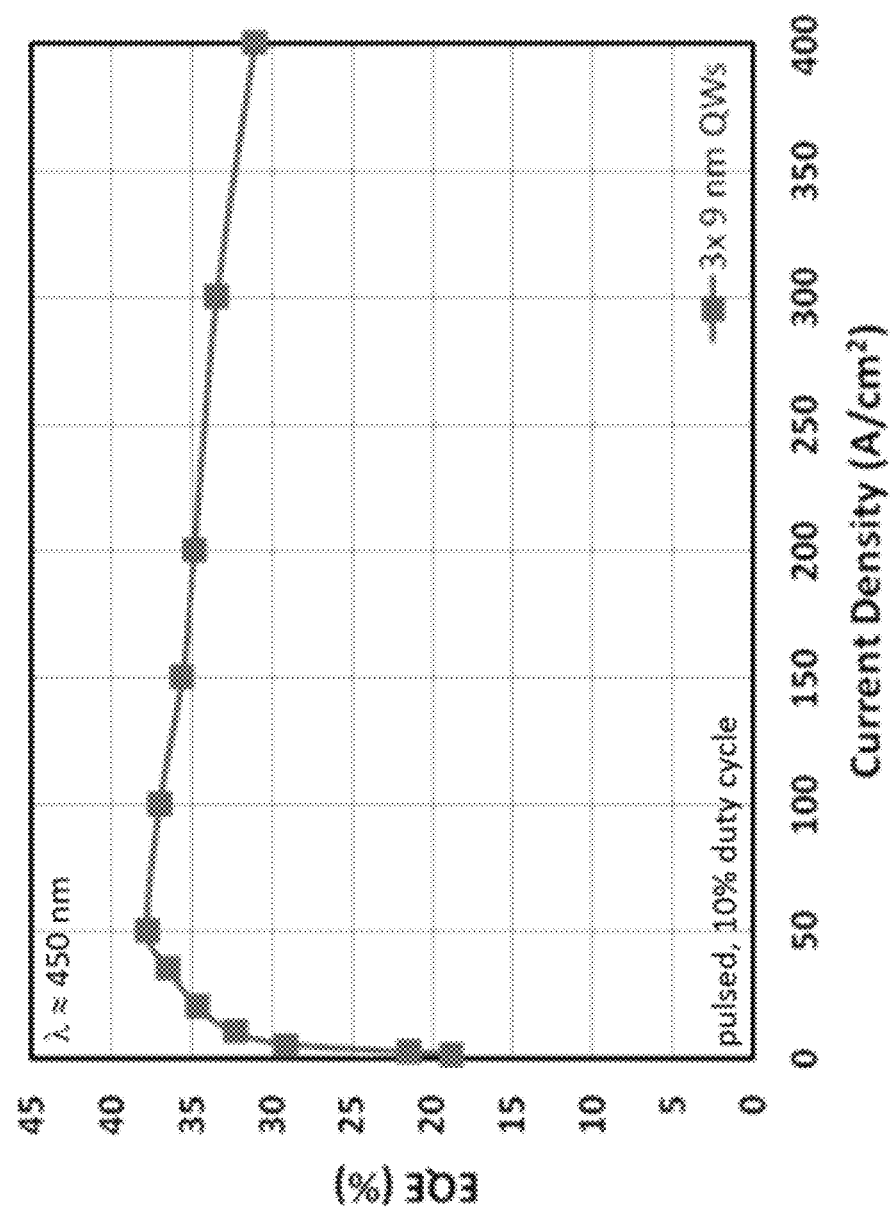
FIG. 4(b) plots EQE (%) as a function of drive current (A/cm$^2$) for a structure similar to that shown in FIG. 2(a) but with an active region comprising 3 periods of 9 nm thick QWs emitting at a peak wavelength of 450 nm.

FIG. 4(b) plots EQE (%) as a function of drive current (A/cm$^2$) for a structure similar to that shown in FIG. 2(a), but with an active region 208 comprising 3 periods of 9 nm thick QWs emitting at a peak wavelength of 450 nm. Lower droop is achieved with the wider QWs (e.g., 9 nm thickness). The device of FIG. 4(b) is packaged using Transparent LED packaging as described in FIG. 2(c) or [2] or U.S. Utility patent application Ser. No. 12/908,793, entitled "LED PACKAGING METHOD WITH HIGH LIGHT EXTRACTION AND HEAT DISSIPATION USING A TRANSPARENT VERTICAL STAND STRUCTURE," filed on Oct. 20, 2010, by Chih Chien Pan, Jun Seok Ha, Steven P. DenBaars, Shuji Nakamura, and Junichi Sonoda. The measurement in FIG. 4(b) is for pulsed current (10% duty cycle). The Droop % shown in FIG. 4(b) is 2.0% (at 100 A/cm$^2$ current density), 7.7% (at 200 A/cm$^2$ current density), 11.5% (at 300 A/cm$^2$ current density), and 17.7% (at 400 A/cm$^2$ current density).

Figure 5:
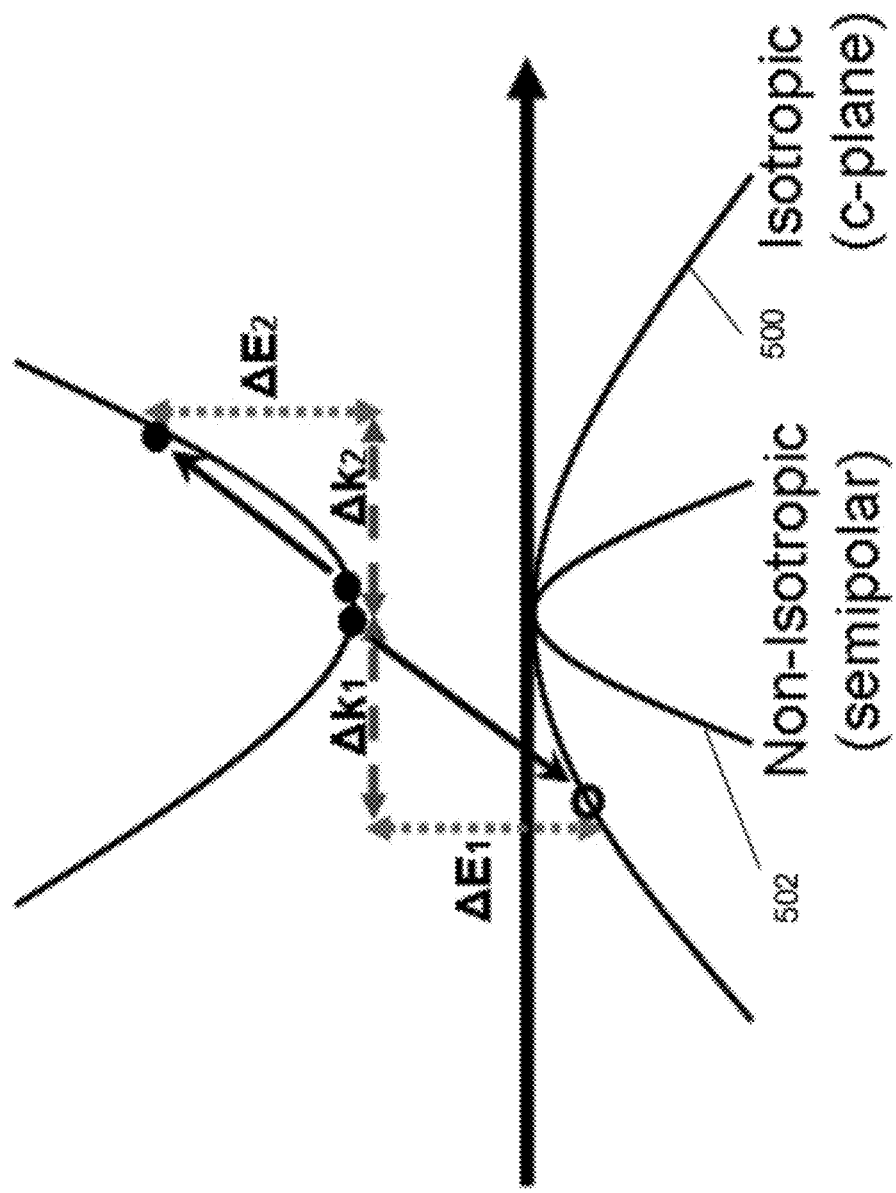
FIG. 5 is a diagram that illustrates the Auger recombination process for isotropic strain in c-plane III-nitride, and non-isotropic strain in semipolar plane III-nitride.

On nonpolar and semipolar planes, unbalanced in-plane biaxial strain causes the curvature of the highest valance band to increase. As a result, the symmetry between the valence band and conduction band curvatures is increased. For wide band gap materials, symmetric conduction and valence bands may suppress Auger recombination, which is widely accepted as the mechanism responsible for efficiency droop. FIG. 5 is a diagram that illustrates the Auger recombination process for isotropic strain in c-plane III-nitride 500, and non-isotropic strain in semipolar plane III-nitride 502, wherein $\Delta k$ and $\Delta E$ are the differences in momentum and energy, respectively, which should have same magnitudes but with opposite signs ($\Delta k_1 + \Delta k_2 = 0$; $\Delta E_1 + \Delta E_2 = 0$), in order to obey the momentum and energy conservations for the electrons and holes transitions in the conduction and valence bands, respectively. Therefore, LEDs grown on nonpolar or semipolar orientations of GaN may show reduced efficiency droop in general. In this invention, the preferred embodiment utilizes the semipolar (20-2-1) plane.

Light-emitting devices grown on semipolar (20-2-1) have shown reduced blue shift and lower FWHM compared to c-plane light-emitting devices. This difference is particularly strong for high indium compositions (i.e., long wavelength emitters). This observation implies that quantum wells grown on semipolar (20-2-1) may have superior alloy uniformity to those grown on c-plane. Recently, alloy scattering has been implicated as one source of Auger recombination in InGaN/GaN LEDs. With superior alloy uniformity, alloy scattering will be reduced and therefore LEDs grown on semipolar (20-2-1) should demonstrate reduced efficiency droop in general.

Possible Modifications And Variations

The device 200 can be a semipolar or nonpolar device. The substrate 202 can be a semipolar or nonpolar III-nitride substrate. The device layers 204-212 can be semipolar or nonpolar layers, or have a semipolar or nonpolar orientation (e.g., layers 204-212 can be grown on or above each other and/or on or above the top/main/growth surface 228 of the substrate 202, wherein the top/main/growth surface 230 and top surface of the device layers (e.g., active layers) 208 is a semipolar (e.g., 20-2-1 or {20-2-1}) or nonpolar plane.

Variations in active region design, such as modifying the number of QWs, the thickness of the QWs, the QW and barrier compositions, and the active region doping level, are possible alternatives. The SL layers on the n-side and p-side may also be modified. For example, either of these layers may be omitted, contain a different number of periods, have alternative compositions or dopings, or be grown with different thicknesses than shown in the preferred embodiment. Other semipolar planes or semipolar substrates could be used.

Other variations include various possible epitaxial growth techniques (Molecular Beam Epitaxy (MBE), MOCVD, Vapor Phase Epitaxy, Hydride Vapor Phase Epitaxy (HVPE) etc.), different dry-etching techniques such as Inductively Coupled Plasma (ICP) etching, Reactive Ion Etching (RIE), Focused Ion beam (FIB) milling, Chemical Mechanical Planarization (CMP), and Chemically Assisted Ion Beam Etching (CAIBE). Formation of high light extraction structures, flip chip LEDs, vertical structure LEDs, thin GaN LEDs, chip-shaped LEDs, and advanced packaging methods, such as a suspended package, transparent stand package, etc., can also be used.

Advantages and Improvements over the Prior Art

Although n-SLs have been utilized in many LED structures (e.g., c-plane, semipolar sapphire substrate based-LEDs, SiC substrate based LEDs, other kinds of compound semiconductor substrates), most of the semipolar GaN-substrate-based LEDs have not adopted n-SLs due to a lack of evidence of improvement in device properties (e.g., output power) with the addition of n-SLs. The n-SLs implemented in this invention are grown with $Si_2H_6$ flow and each layer in the n-SLs is doped with silicon. If an LED grown on {20-2-1} comprises these n-SLs, the LED will typically have a low Droop ratio. If these kinds of n-SLs are located below the QWs, a higher number of QWs (more than three periods QW) can be utilized.

Figure 6:
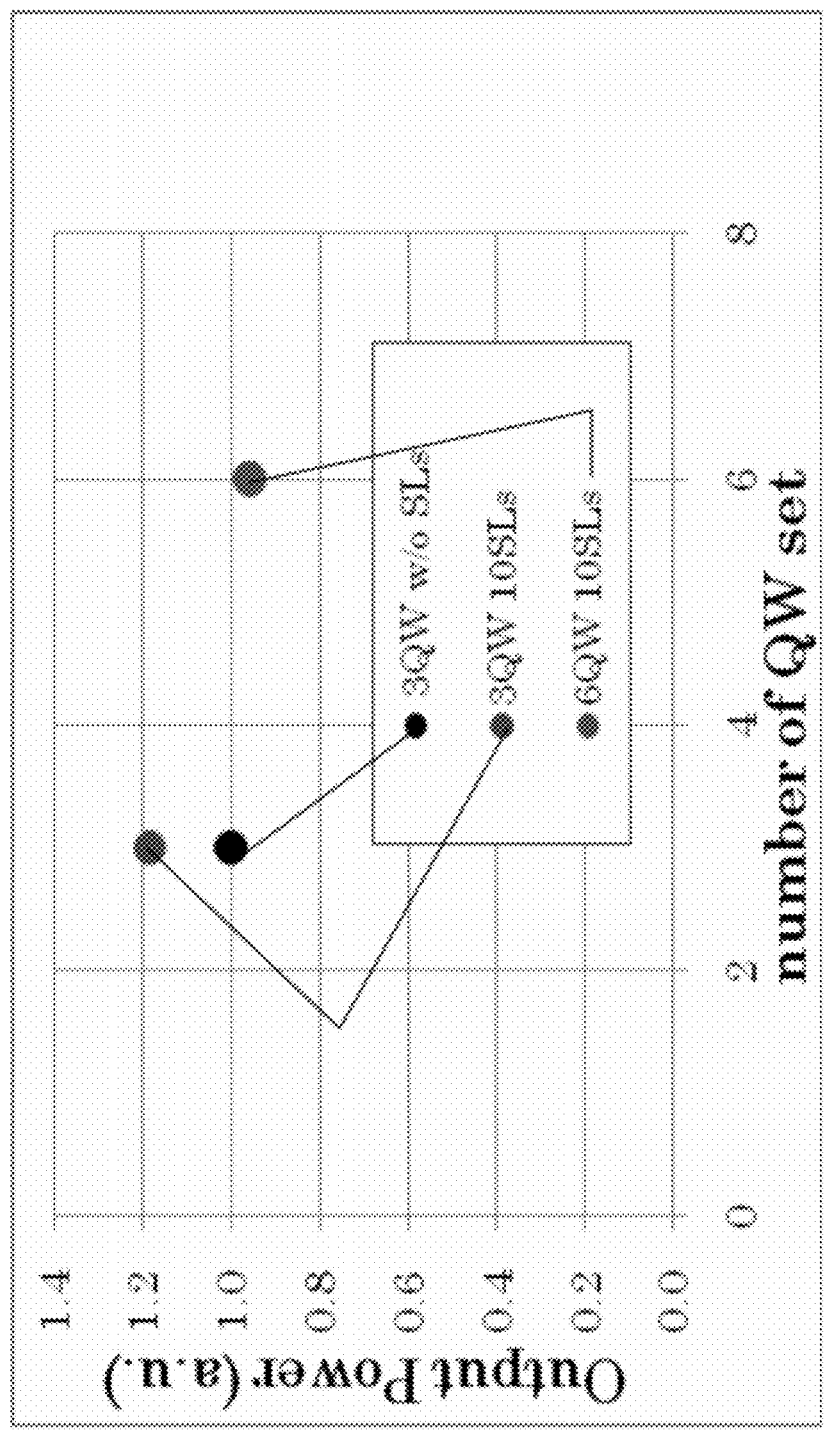
FIG. 6 is a graph showing a comparison output power between a device without SLs and a device with SLs on a semipolar (20-2-1) GaN substrate.

Consider, for example, FIG. 6, which shows a comparison output power between a device without SLs and a device with SLs on a semipolar {20-2-1} GaN substrate. Specifically, FIG. 6 is a graph of Output Power in arbitrary units (a.u.) vs. the Number of QWs, showing results for a 3 period QW (3QW) without (w/o) SLs, a 3QW with a 10 period SL or 10 periods or sets of SL layers (10 SLs), and a 6 period QW (6QW) with 10 SLs.

Figure 7:
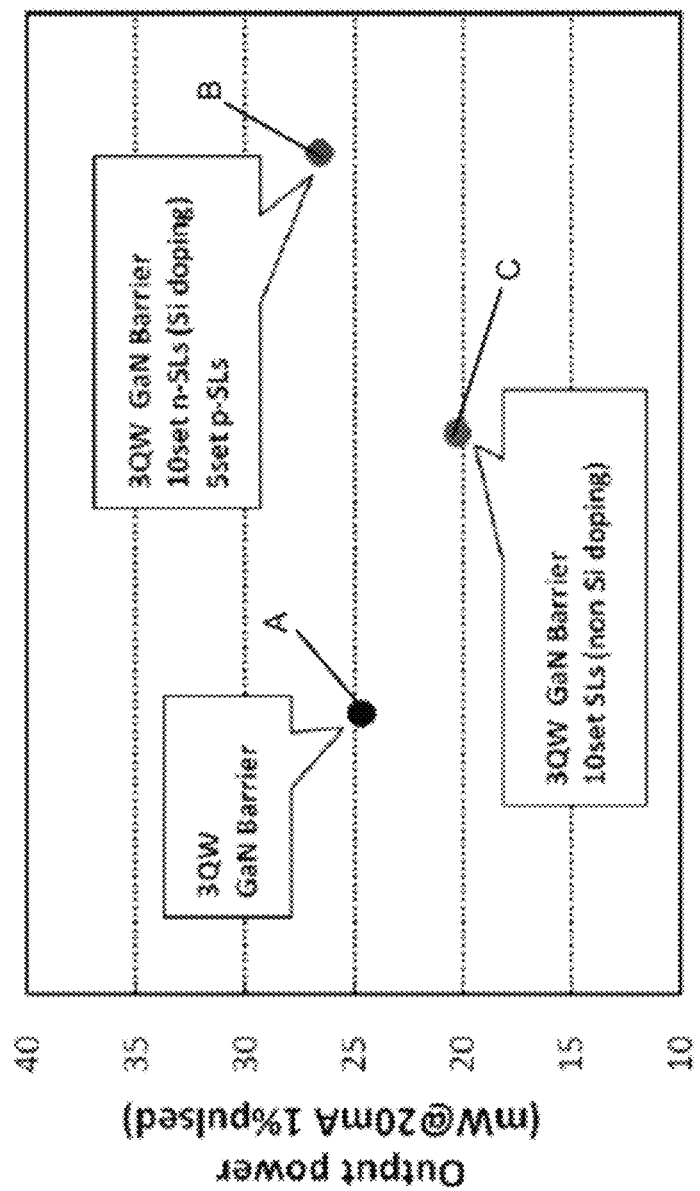
FIG. 7 is a graph plotting output power in mW, at a drive current of 20 mA (pulsed at 1%), for three semipolar (20-2-1) LED device structures A, B, C based on FIG. 2(a), wherein device A has a 3 period QW (3QW) active region with GaN barriers, device B has a 3QW active region with GaN barriers, 10 sets of n-SLs with Si doping, and 5 sets of p-SLs, and device C has a 3QW active region with GaN barriers and 10 sets of SLs with no doping.

FIG. 7 is a graph plotting output power in mW, at a drive current of 20 mA (pulsed at 1%), for three semipolar (20-2-1) LED device structures A, B, C having the structure based on FIG. 2(a), wherein device A has a 3 period QW (3QW) active region with GaN barriers, device B has a 3QW active region with GaN barriers, 10 sets of n-SLs with Si doping, and 5 sets or periods of a p-SL or p-SL layers (5 SLs), and device C has a 3QW active region with GaN barriers and 10 sets of SLs with no doping.

Figure 8:
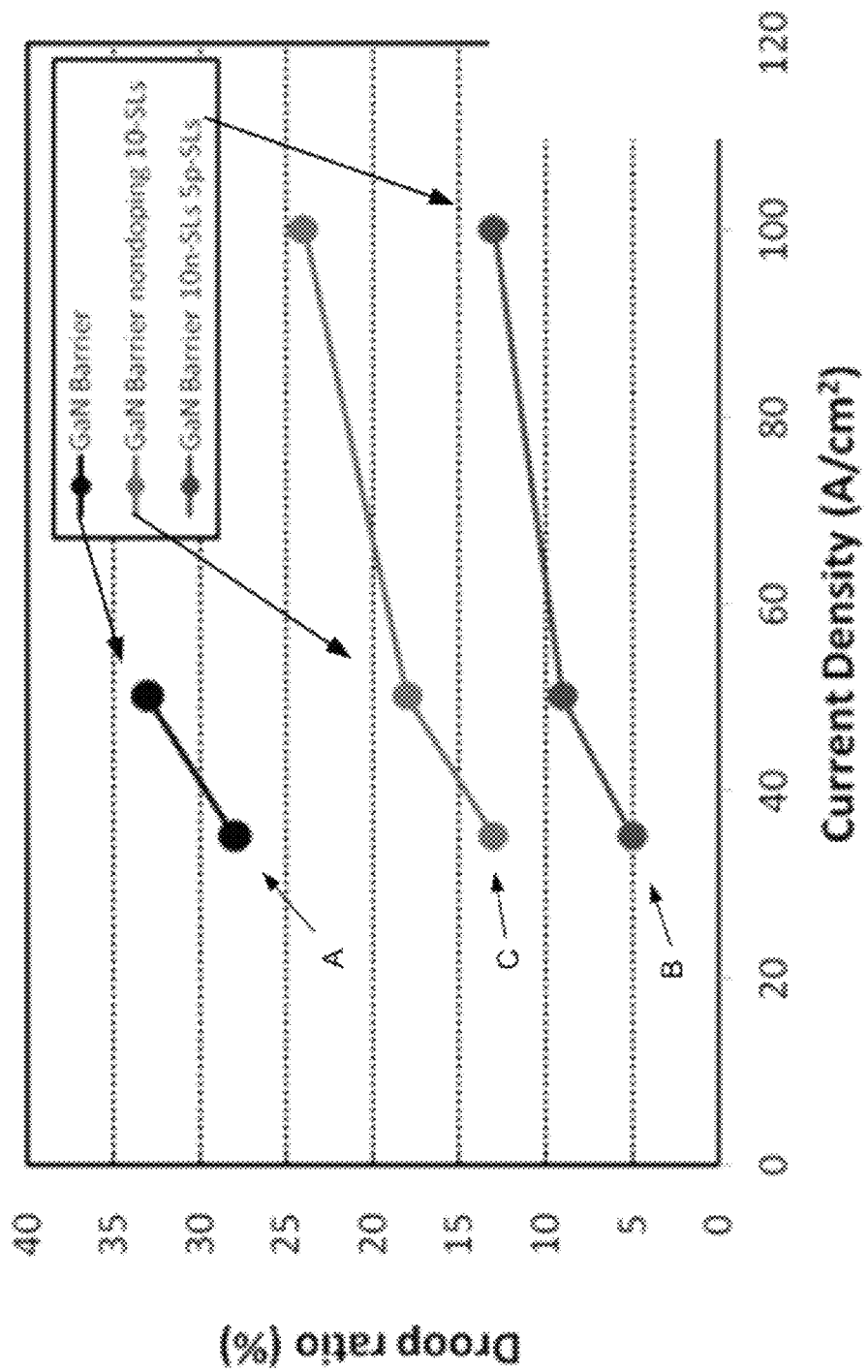
FIG. 8 is a graph plotting droop ratio as a function of drive current, for three semipolar (20-2-1) LED device structures A, B, C based on FIG. 2(a), wherein device A has a 3QW active region with GaN barriers, device B has a 3QW active region with GaN barriers, 10 sets of n-SLs with Si doping, and 5 sets of p-SLs, and device C has a 3QW active region with GaN barriers and 10 sets of SLs with no doping.

FIG. 8 is a graph plotting droop ratio as a function of drive current, for three semipolar (20-2-1) LED device structures A, B, C having the structure based on FIG. 2(a), wherein device A has a 3QW active region with GaN barriers, device B has a 3QW active region with GaN barriers, 10 sets of n-SLs with Si doping, and 5 sets of p-SLs, and device C has a 3QW active region with GaN barriers and 10 sets of SLs with no doping.

Figure 9:
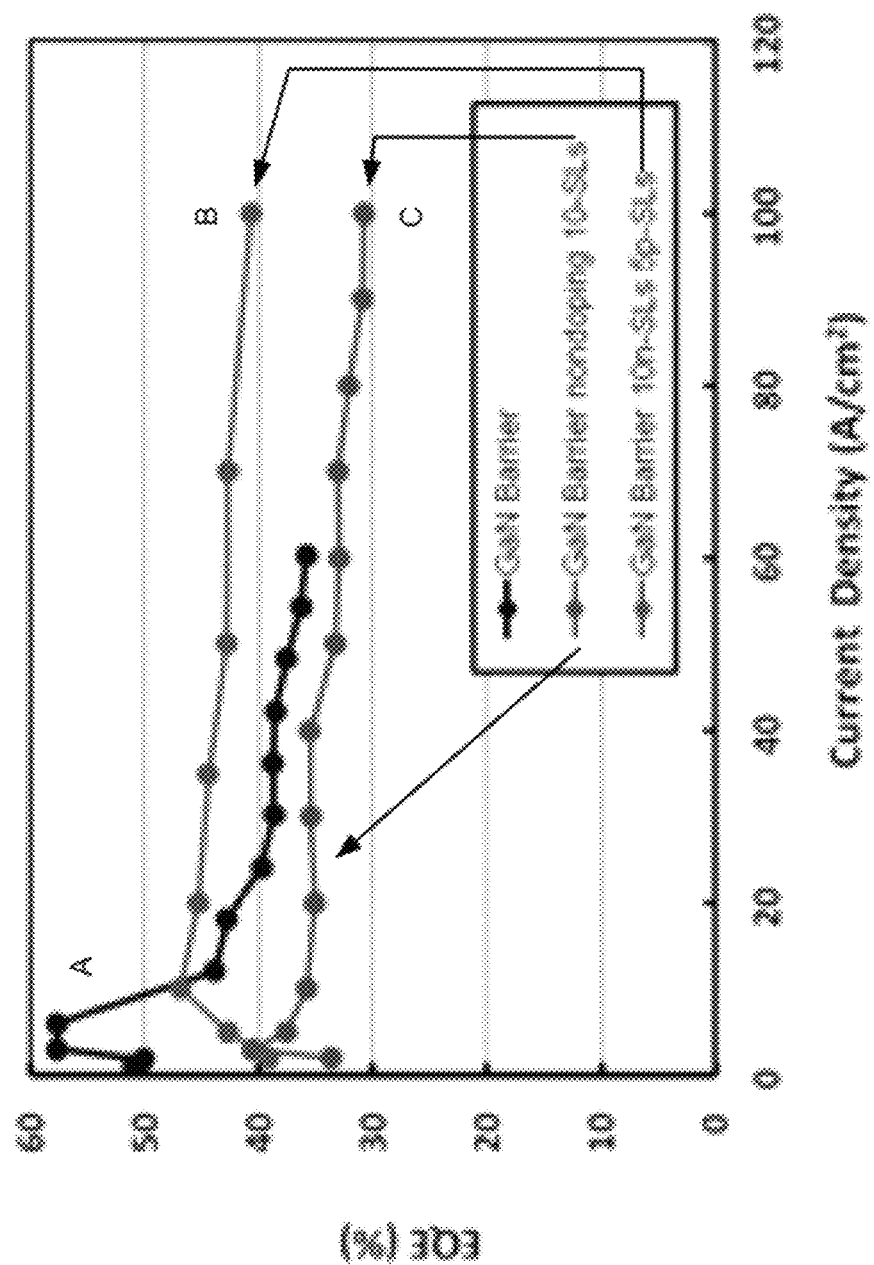
FIG. 9 is a graph plotting EQE as a function of drive current for three semipolar (20-2-1) LED device structures A, B, C based on FIG. 2(a), wherein device A has a 3QW active region with GaN barriers, device B has a 3QW active region with GaN barriers, 10 sets of n-SLs with Si doping, and 5 sets of p-SLs, and device C has a 3QW active region with GaN barriers and 10 sets of SLs with no doping.

FIG. 9 is a graph plotting EQE (%) as a function of drive current (A/cm$^2$) for three semipolar (20-2-1) LED device structures A, B, C having the structure based on FIG. 2(a), wherein device A has a 3QW active region with GaN barriers, device B has a 3QW active region with GaN barriers, 10 sets of n-SLs with Si doping, and 5 sets of p-SLs, and device C has a 3QW active region with GaN barriers and 10 sets of SLs with no doping.

Nomenclature

The terms "(Al,Ga,In)N", "GaN", "InGaN", "AlGaInN", "Group-III nitride", "III-nitride", or "nitride", and equivalents thereof, are intended to refer to any alloy composition of the (Al,Ga,In)N semiconductors having the formula $Al_xGa_yIn_zN$ where $0 \leq x \leq 1$, $0 \leq y \leq 1$, $0 \leq z \leq 1$, and $x+y+z=1$. These terms are intended to be broadly construed to include respective nitrides of the single species, Al, Ga, and In, as well as binary and ternary compositions of such Group III metal species. Accordingly, it will be appreciated that the discussion of the invention hereinafter in reference to GaN and InGaN materials is applicable to the formation of various other (Al,Ga,In)N material species. Further, (Al,Ga,In)N materials within the scope of the invention may further include minor quantities of dopants and/or other impurity or inclusional materials.

Many (Al,Ga,In)N devices are grown along the polar c-plane of the crystal, although this results in an undesirable quantum-confined Stark effect (QCSE), due to the existence of strong piezoelectric and spontaneous polarizations. One approach to decreasing polarization effects in (Al,Ga,In)N devices is to grow the devices on nonpolar or semipolar planes of the crystal.

The term "nonpolar plane" includes the {11-20} planes, known collectively as a-planes, and the {10-10} planes, known collectively as m-planes. Such planes contain equal numbers of Group-III (e.g., gallium) and nitrogen atoms per plane and are charge-neutral. Subsequent nonpolar layers are equivalent to one another, so the bulk crystal will not be polarized along the growth direction.

The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero l Miller index. Subsequent semipolar layers are equivalent to one another, so the crystal will have reduced polarization along the growth direction.

The equilibrium critical thickness corresponds to the case when it is energetically favorable to form one misfit dislocation at the layer/substrate interface.

Experimental, or kinetic critical thickness, is always somewhat or significantly larger than the equilibrium critical thickness. However, regardless of whether the critical thickness is the equilibrium or kinetic critical thickness, the critical thickness corresponds to the thickness where a layer transforms from fully coherent to partially relaxed.

Another example of the critical thickness is the Matthews Blakeslee critical thickness $h_e$ [3].

REFERENCES

The following references are incorporated by reference herein:
1. "High-Power Blue-Violet Semipolar (20-2-1) InGaN/GaN Light-Emitting Diodes with Low Efficiency Droop at 200 A/cm$^2$", by Yuji Zhao, Shinichi Tanaka, Chih-Chien Pan, Kenji Fujito, Daniel Feezell, James S. Speck, Steven P. DenBaars, and Shuji Nakamura, Applied Physics Express 4 (2011) 082104.
2. "Vertical Stand Transparent Light-Emitting Diode Architecture for High-Efficiency and High-Power Light Emitting Diodes," by C. C. Pan, I. Koslow, J. Sonoda, H. Ohta, J. S. Ha, S. Nakamura, and S. P. DenBaars: Jpn. J. Appl. Phys. 49 (2010) 080210.
3. J. Matthews and A. Blakeslee, J. Cryst. Growth 32 265 (1976).

CONCLUSION

This concludes the description of the preferred embodiments of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An opto-electronic device structure, comprising at least:
a III-nitride light-emitting device structure, grown on or above a semipolar Group-III nitride substrate, having a semipolar plane surface wherein the light-emitting device structure has an External Quantum Efficiency (EQE) droop of 15% percent or less, as compared to a peak EQE, at a current density of at least 35 Amps per centimeter square (A/cm$^2$).

2. The device structure of claim 1, wherein the droop is less than 1% at the current density of at least 35 A/cm$^2$ and less than 10% at the current density of at least 100 A/cm$^2$.

3. The device structure of claim 1, wherein the light-emitting device structure has a peak emission at a blue emission wavelength.

4. The device structure of claim 1, wherein the semipolar Group-III nitride substrate is semipolar Gallium Nitride (GaN) substrate.

5. The device structure of claim 1, wherein the semipolar Group-III nitride substrate is a semipolar (20-2-1) Gallium Nitride (GaN) substrate.

6. The device structure of claim 1, wherein the light-emitting device structure includes an n-type III-nitride superlattice (n-SL).

7. The device structure of claim 1, further comprising an n-type III-nitride superlattice (n-SL) comprising one or more indium (In) containing layers and gallium (Ga) containing layers.

8. The device structure of claim 1, further comprising an n-type III-nitride superlattice (n-SL) comprising layers having different III-nitride composition and wherein each of the layers is doped with Silicon.

9. The device structure of claim 1, further comprising an n-type III-nitride superlattice (n-SL) located below an active region of the light-emitting device.

10. The device structure of claim 9, wherein the active region includes two or more quantum wells (QW).

11. The device structure of claim 9, wherein:
the active region comprises one or more indium containing III-nitride quantum wells (QWs) with III-nitride barriers, the quantum wells having a QW number, a QW composition, and a QW thickness, the barriers having a barrier composition, barrier thickness, and barrier doping,
the n-SL comprises a number of periods, an SL doping, an SL composition, and layers each having a layer thickness, and
the QW number, the QW composition, the QW thickness, the barrier composition, the barrier thickness, the barrier doping, the number of periods, the SL doping, the SL composition, and the layer thickness are such that:
the III-nitride light-emitting device structure comprising a light emitting diode (LED) has a peak emission at a blue emission wavelength or longer, and
the EQE droop is 15% or less when the device is driven at a current density of at least 35 Amps per centimeter square (A/cm$^2$).

12. The device structure of claim 9, further comprising:
a first III-nitride layer or buffer layer on or above the Group-III nitride substrate comprising a GaN substrate;
the n-SL on or above the first layer or buffer layer, wherein:
the n-SL comprises alternating first and second III-nitride layers having different III-nitride composition,
the first and second III-nitride layers comprise strain compensated layers that are lattice matched to the first layer or buffer layer,
the first and second III-nitride layers have a thickness that is below their critical thickness for relaxation,
a number of periods of the n-SL is such that the active region is separated from the first layer or buffer layer by at least 500 nanometers, and
the active region comprises at least three InGaN quantum wells with GaN barriers, wherein the InGaN quantum wells have a thickness of at least 3 nanometers.

13. The device structure of claim 9, further comprising a p-type III-nitride superlattice (p-SL) on or above the active region.

14. The device structure of claim 9, wherein the active region emits light having a peak wavelength corresponding to light having a green wavelength or longer.

15. The device structure of claim 9, further comprising:

an n-type GaN layer on or above a semi-polar plane of the substrate, wherein:
the substrate is a semi-polar GaN substrate having a roughened backside and the roughened backside extracts light from the light emitting device, and
the n-SL comprises alternating InGaN and GaN layers on or above the n-type GaN layer;
the active region, comprising InGaN multi quantum wells (MQWs) with GaN barriers, on or above the n-SL;
a p-type superlattice (p-SL) on or above the active region, comprising alternating AlGaN and GaN layers;
a p-type GaN layer on or above the p-SL;
a p-type transparent conductive layer on or above the p-type GaN layer;
a p-type pad on or above the p-type transparent conductive layer;
an n-type contact to the n-type GaN layer;
a Zinc Oxide (ZnO) submount attached to the roughened backside of the semipolar GaN substrate;
a header attached to an end of the ZnO submount; and
an encapsulant encapsulating the device structure comprising a light emitting diode (LED), wherein an active area of the LED is 0.1 mm$^2$ or less.

16. The device structure of claim 1, wherein the light-emitting device structure:

has a semi-polar orientation, strain, reduced defects, an alloy uniformity, and an active region comprising a number of indium containing quantum wells forming the semipolar band structure, and
is mounted in a light emitting diode (LED) device, and
wherein the LED device has the EQE droop of 15% percent or less at the current density of at least 35 Amps per centimeter square (A/cm$^2$).

17. The device structure of claim 1, wherein:

the light emitting device structure includes one or more strain compensated layers between an active region and the substrate, and
each of the strain compensated layers have a lattice matching, composition, a thickness below a critical thickness, and a position that engineer strain and defects in the active region wherein the light-emitting device structure has the EQE droop of 15% percent or less.

18. The device structure of claim 17, wherein the strain includes non-isotropic biaxial strain.

19. The device structure of claim 1, wherein the III-nitride light-emitting device structure has a semipolar orientation and band structure wherein the light-emitting device structure has the External Quantum Efficiency (EQE) droop of 15% percent or less, as compared to the peak EQE, at the current density of at least 35 Amps per centimeter square (A/cm$^2$).

20. A method of fabricating an opto-electronic device, comprising:

growing a III-nitride light emitting device structure on or above a semipolar Group-III nitride substrate, having a semipolar plane surface, wherein:
the light-emitting device structure has an External Quantum Efficiency (EQE) droop of 15% percent or less, as compared to a peak EQE, at a current density of at least 35 Amps per centimeter square (A/cm$^2$).

21. The method of claim 20, wherein:

the light-emitting device has a light output power that is at least 50 milliwatts,
the EQE droop is less than 1% at the current density of at least 35 A/cm$^2$ and less than 10% at the current density of at least 100 A/cm$^2$, and
the light emitting device structure has a peak emission at a blue emission wavelength.

22. The method of claim 20, wherein the semipolar Group-III nitride substrate is a semipolar Gallium Nitride (GaN) substrate.

23. The method of claim 20, wherein the semipolar Group-III nitride substrate is a semipolar (20-2-1) Gallium Nitride (GaN) substrate.

24. The method of claim 20, wherein the light-emitting device structure includes an n-type III-nitride superlattice (n-SL) and the n-SL comprises III-nitride layers, the method further comprising growing the n-SL's III-nitride layers with Si$_2$H$_6$ flow, wherein each of the III-nitride layers is doped with Silicon.

25. The method claim 20, wherein:

the light-emitting device structure includes an n-type III-nitride superlattice (n-SL) and the n-SL is located below an active region of the light-emitting device,
the active region comprises two or more indium containing quantum wells (QWs) with barriers, the quantum wells having a QW number, a QW composition, and a QW thickness, the barriers having a barrier composition, barrier thickness, and barrier doping,
the n-SL comprises a number of periods, an SL doping, an SL composition, and layers each having a layer thickness, and
the QW number, the QW composition, the QW thickness, the barrier composition, the barrier thickness, the barrier doping, the number of periods, the SL doping, the SL composition, the layer thickness are such that:
the III-nitride light emitting device structure comprising a light emitting diode (LED) device has a peak emission at a blue emission wavelength or longer, and
the EQE droop is 15% or less when the LED device is driven at a current density of at least 35 Amps per centimeter square (A/cm$^2$).

26. The method of claim 20, wherein the light-emitting device structure includes an n-type III-nitride superlattice (n-SL).

* * * * *